United States Patent [19]

Senoo et al.

[11] Patent Number: 5,111,148

[45] Date of Patent: May 5, 1992

[54] BATTERY VOLTAGE DISCRIMINATOR CIRCUIT

[75] Inventors: Seiiti Senoo; Yoshio Watanabe, both of Nara, Japan

[73] Assignee: Sharp Kabushiki Kaisha, Japan

[21] Appl. No.: 530,561

[22] Filed: May 30, 1990

[30] Foreign Application Priority Data

May 31, 1989 [JP] Japan .................................. 1-137670

[51] Int. Cl.⁵ ............................................ G01N 27/27
[52] U.S. Cl. ..................................... 324/433; 324/429
[58] Field of Search ............... 324/433, 426, 427, 429; 340/636; 320/48

[56] References Cited

U.S. PATENT DOCUMENTS

| | | | |
|---|---|---|---|
| 3,870,954 | 3/1975 | Hanson et al. | 324/158 |
| 4,352,067 | 9/1982 | Ottone | 324/429 X |
| 4,521,735 | 6/1985 | Kageyama et al. | 324/433 |
| 4,618,780 | 10/1986 | Ikoma et al. | 307/130 |
| 4,888,716 | 12/1989 | Ueno | 324/429 X |
| 4,949,046 | 8/1990 | Seyfang | 324/427 |

FOREIGN PATENT DOCUMENTS

| | | | |
|---|---|---|---|
| 2400901 | 1/1974 | Fed. Rep. of Germany | 324/433 |
| 3403798 | 8/1984 | Fed. Rep. of Germany | |
| 62-87878 | 4/1987 | Japan | |
| 63-109662 | 7/1988 | Japan | |

OTHER PUBLICATIONS

IBM Technical Disclosure Bulletin, vol. 29, No. 6, Nov. 1986, pp. 2641-2643; "Method for warning users of a low battery-powered computer".

IBM Technical Disclosure Bulletin, vol. 26, No. 108, Mar. 1984, pp. 5371-5372; J. M. Joyce et al: "Self-adjusting overcurrent for current mode, regenerative driven, high frequency power supplies".

Primary Examiner—Kenneth A. Wieder
Attorney, Agent, or Firm—Nixon & Vanderhye

[57] ABSTRACT

A battery voltage discriminator circuit for an apparatus having a battery and a plurality of loads which are driven by the battery and operate under various kinds of load conditions is disclosed. When the output voltage of said battery means drops under a predetermined reference voltage, the circuit generates a signal indicative of the voltage drop. The circuit has a reference voltage setting circuit for setting the reference voltage to one of predetermined values, which corresponds to the kind of the current load condition, and a reference voltage change circuit for activating the reference voltage setting circuit for a period of time in response to the change in the kind of current load condition.

10 Claims, 5 Drawing Sheets

BATTERY VOLTAGE DISCRIMINATOR CIRCUIT

BACKGROUND OF THE INVENTION

1. Field of the Invention

This invention relates to a battery voltage discriminator circuit for use in an electronic apparatus such as a portable word processor, and more particularly to a battery voltage discriminator circuit for determining whether or not the battery has been consumed to the extent that it is no longer able to normally drive the apparatus.

2. Description of the Prior Art

A conventional battery voltage discriminator circuit provided in such an electronic apparatus using a battery as a drive power source is usually arranged as shown in FIG. 7. The terminal voltage $V_B$ of a battery $B_a$ which is used as a drive power source is converted by a DC—DC converter PS into a constant voltage adjusted to a predetermined load voltage $V_C$ which is in turn supplied to a load $L_O$. The battery voltage $V_B$ is divided by two resistors $R_1$ and $R_2$ to generate a detection battery voltage $V_1$ the level of which corresponds to that of the battery voltage $V_B$ as shown in (a) of FIG. 8. The detection battery voltage $V_1$ is inputted to an inverting input terminal of a comparator CP. The load voltage $V_C$ is divided by two resistors $R_3$ and $R_4$ to generate a predetermined reference voltage $V_2$ which is input to a non-inverting input terminal of the comparator CP. When the detection battery voltage $V_1$ drops to the reference voltage $V_2$, the output terminal of the comparator CP becomes high to output an abnormal voltage detection signal LB as shown in (b) of FIG. 8, so that an alarm is given to indicate that the battery $B_a$ has been consumed to the extent that it is no longer available for use. In FIG. 7, capacitors $C_1$ and $C_2$ are provided for eliminating ripples from the battery voltage $V_B$ and the load voltage $V_C$.

The case will be considered in which the circuit of FIG. 7 is applied to a portable computer or word processor having a variety of loads such as a printer, a modem, a buzzer, an LED indicator or the like. When any abrupt change in load occurs as in the starting of an X-directional drive motor for the printer or on the connection of the modem to a communication line, there may occur an overcurrent flowing to cause a drop in the battery voltage $V_B$ and a momentary sudden drop in the detection battery voltage $V_1$ to a lower voltage level than the reference voltage $V_2$, with the result that an abnormal voltage detection signal LB is produced despite the fact that the battery $B_a$ has not been consumed to the extent of being no longer available for use.

In order to obviate such inconvenience, measures have been taken such that when an abnormal voltage detection signal is output upon the occurrence of any abrupt load fluctuations, no alarm of such occurrence is given, or such that the detection conditions for battery consumption detection are set to comply the maximum conceivable load condition in which, for example, the printer prints black on the entire surface of a recording paper sheet.

However, these measures have been found unsatisfactory. With the first mentioned measure, it is impossible to accurately detect, as originally intended thereby, that the battery voltage has dropped to the extent that it is no longer available for driving the apparatus. With the latter measure in which, even when the load condition is low, the degree of battery consumption is determined according to detection conditions corresponding to the maximum possible load condition, it is likely that an abnormal voltage detection signal will be erroneously produced even if the battery is still available for effective use. Therefore, the latter measure permits no efficient use of the battery, which is disadvantageous from the standpoint of economy.

SUMMARY OF THE INVENTION

The battery voltage discriminator circuit of this invention, which overcomes the above-discussed and numerous other disadvantages and deficiencies of the prior art, and is used for an apparatus having a battery means and a plurality of loads which are driven by said battery means, said loads operating under various kinds of load conditions, and for, when the output voltage of said battery means drops under a predetermined reference voltage, generating a signal indicative of the voltage drop, and comprises: a reference voltage setting means for setting said reference voltage to one of predetermined values, said one value corresponding to the kind of the current load condition; and a reference voltage change means for activating said reference voltage setting means for a period of time in response to the change in the kind of the current load condition.

In a preferred embodiment, the period of time is selected from a plurality of predetermined values in accordance with the kind of the existing load condition.

Thus, the invention described herein makes possible the objectives of:

(1) providing a battery voltage discriminator circuit which can accurately detect the degree of battery consumption even when the load condition is changed over a wide range;

(2) providing a battery voltage discriminator circuit which can accurately detect the degree of battery consumption even when the load condition is changed abruptly;

(3) providing a battery voltage discriminator circuit which can output a signal indicative of the consumed state of a battery even when the load condition is changed over a wide range; and (4) providing a battery voltage discriminator circuit which can output a signal indicative of the consumed state of a battery even when the load condition is changed abruptly.

According to the invention, when there is no occurrence of abrupt load fluctuation, the reference voltage change means is not driven, and hence the output voltage of the battery is compared with a predetermined reference voltage. Upon the occurrence of any foreseeable abrupt load change such as, for example, the start of an X-directional printer drive motor of the printer or the connection to a line of a modem, the reference voltage change means activating the reference voltage setting means so that the reference voltage setting means changes the reference voltage to one the predetermined voltage values corresponding to the current load condition. This change of the reference voltage is maintained preferably only for a predetermined period of time which corresponds to the kind of the current load condition. Since the degree of battery consumption is determined in this way according to the detection conditions in which the reference voltage corresponds to the respective current load condition, it is possible to accurately determine the condition of battery consumption irrespective of load fluctuations and thus to ensure economical use of the battery.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

A preferred embodiment of the invention will now be described with reference to the accompanying drawings.

Figure 1:
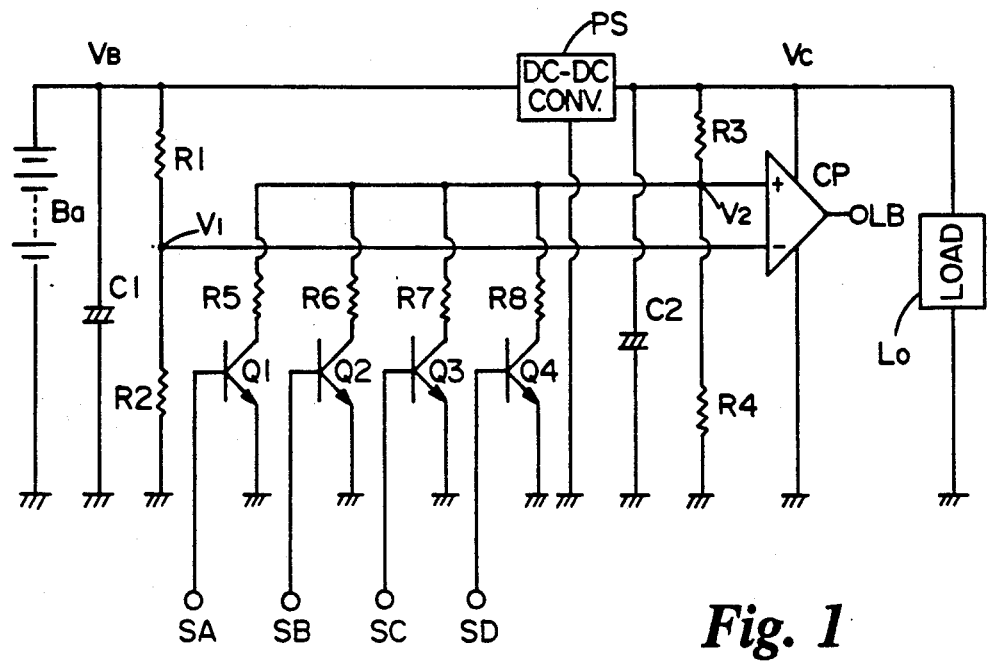
FIG. 1 is a circuit diagram showing an embodiment of the invention.
Figure 7:
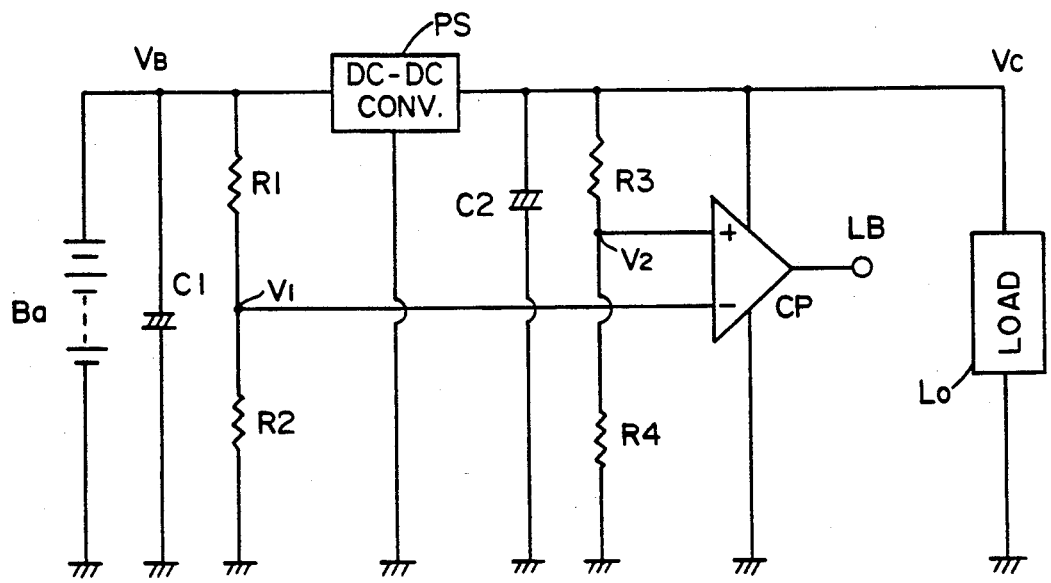
FIG. 7 is a circuit diagram showing a conventional circuit.
Figure 8:
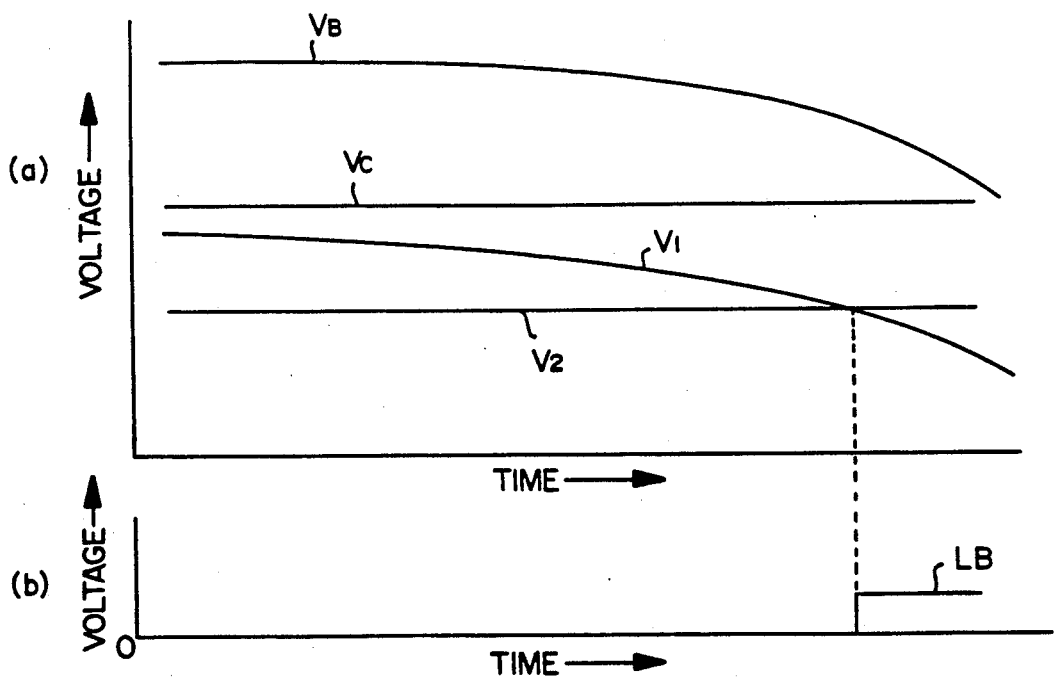
FIG. 8 is a graph showing the relation between a period of using a battery and the battery voltage.

FIG. 1 is a circuit diagram showing one embodiment of the invention which is applied to a portable word processor having loads such as a printer, a modem, a buzzer, and an LED indicator (which are not shown). In FIG. 1, elements identical with or similar to those in FIG. 7 are designated by like reference numerals, and their description is omitted. The circuit shown in FIG. 1 comprises four circuits which have respectively resistors R5-R8 and switching transistors Q1-Q4 connected in series. As described later, these resistors R5-R8 have different resistances, and are used for setting the level of the reference voltage input to the non-inverting input terminal of the comparator CP (hereinafter, each of these resistors is referred to as "the reference voltage setting resistor"). The four circuits are connected in parallel and inserted between the ground and the non-inverting input terminal of the comparator CP to which the reference voltage $V_2$ is input. The bases of the transistors Q1-Q4 are respectively connected with separate control signal terminals SA-SD through which a control signal is supplied from a CPU (not shown) of the word processor.

Figure 3:
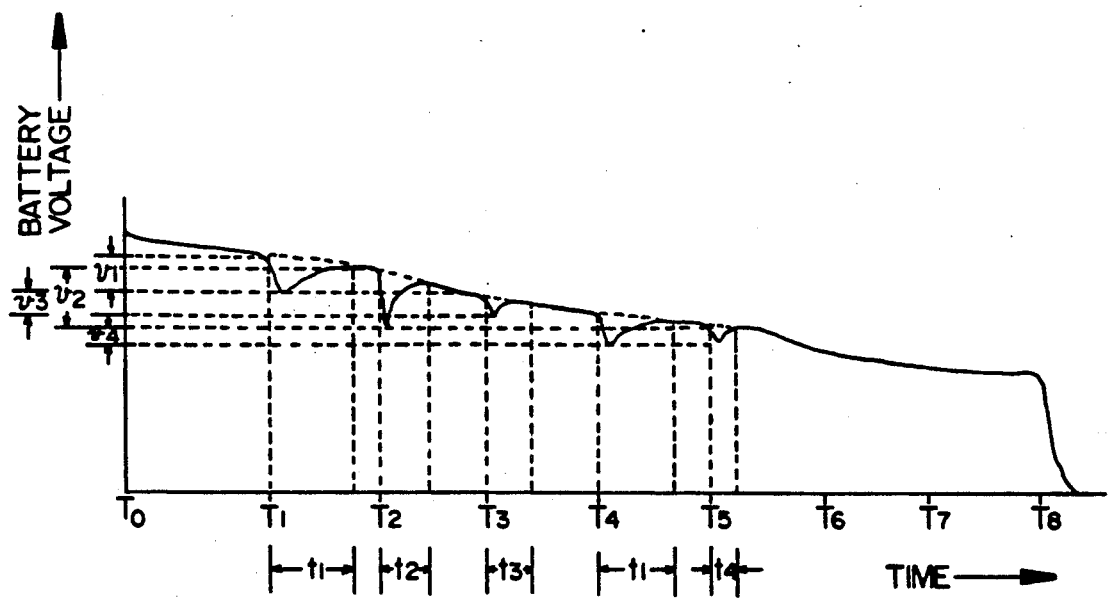
FIG. 3 is a graph showing the variation of the battery voltage when loads are changed.
Figure 4:
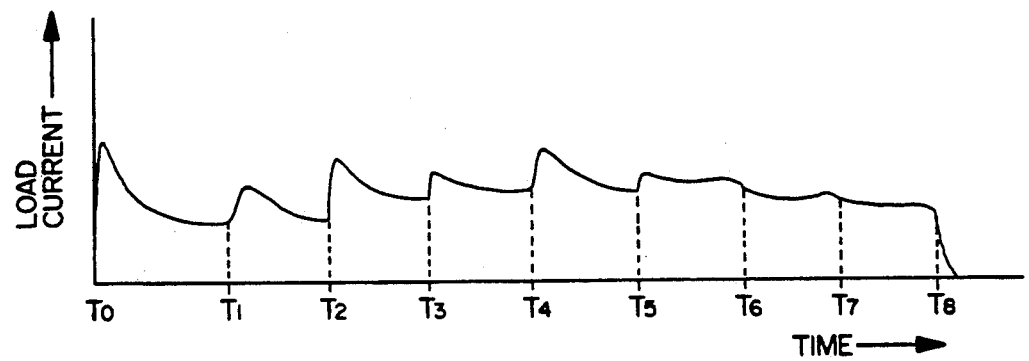
FIG. 4 is a graph showing the variation of the load current when loads are changed as shown in FIG. 3.

In the word processor, there are foreseeable abrupt load changes which will occur in such instances as when the X-directional drive motor of the printer is driven, the modem is connected to a communication line, the buzzer sounds, and the LED indicator lights. FIG. 4 illustrates the changes in the load current caused in the case where the above mentioned load changes have occured in sequence, and FIG. 3 illustrates changes in the battery voltage $V_B$ caused when the load current changes of FIG. 4 occur. More specifically, in these figures are shown changes in the load current and battery voltage in the case where the power supply is turned on at time $T_0$, the motor is started at time $T_1$, the modem is connected at time $T_2$, the buzzer sounds at time $T_3$, the motor is restarted at time $T_4$, the LED indicator is lighted at time $T_5$, the buzzer sounding is stopped at time $T_6$, the LED indicator is turned off at time $T_7$, and the power supply is interrupted at time $T_8$. The duration of battery voltage changes due to the starting of the motor at time $T_1$ and time $T_4$ is $t_1$ (100 msec), and the battery voltage change at the time is $v_1$ (−0.5 V). The duration of the battery voltage change due to the connection of the modem at time $T_2$ is $t_2$ (50 msec), and the battery voltage change at that time is $v_2$ (−0.7 V). The duration of the battery voltage change due to the buzzer sounding at time $T_3$ is $t_3$ (75 msec), and the battery voltage change at that time is $v_3$ (−0.2 V). The duration of the battery voltage change due to the LED lighting at time $T_5$ is $t_4$ (25 msec), and the battery voltage change at that time is $v_4$ (−0.1 V).

On the basis of these actual measurement data, the resistance of the reference voltage setting resistor R5 is selected so that the reference voltage applied to the non-inverting input terminal of the comparator CP is caused to drop by 0.5 V when the transistor Q1 is turned on.

Similarly, the resistance of the reference voltage setting resistor R6 is selected so that the reference voltage is caused to drop by 0.7 V when the transistor Q2 is turned on; that of the reference voltage setting resistor R7 is selected so that the reference voltage is caused to drop by 0.2 V when the transistor Q3 is turned on; and that of the reference voltage setting resistor R8 is selected so that the reference voltage is caused to drop by 0.1 V when the transistor Q4 is turned on.

Figure 2:
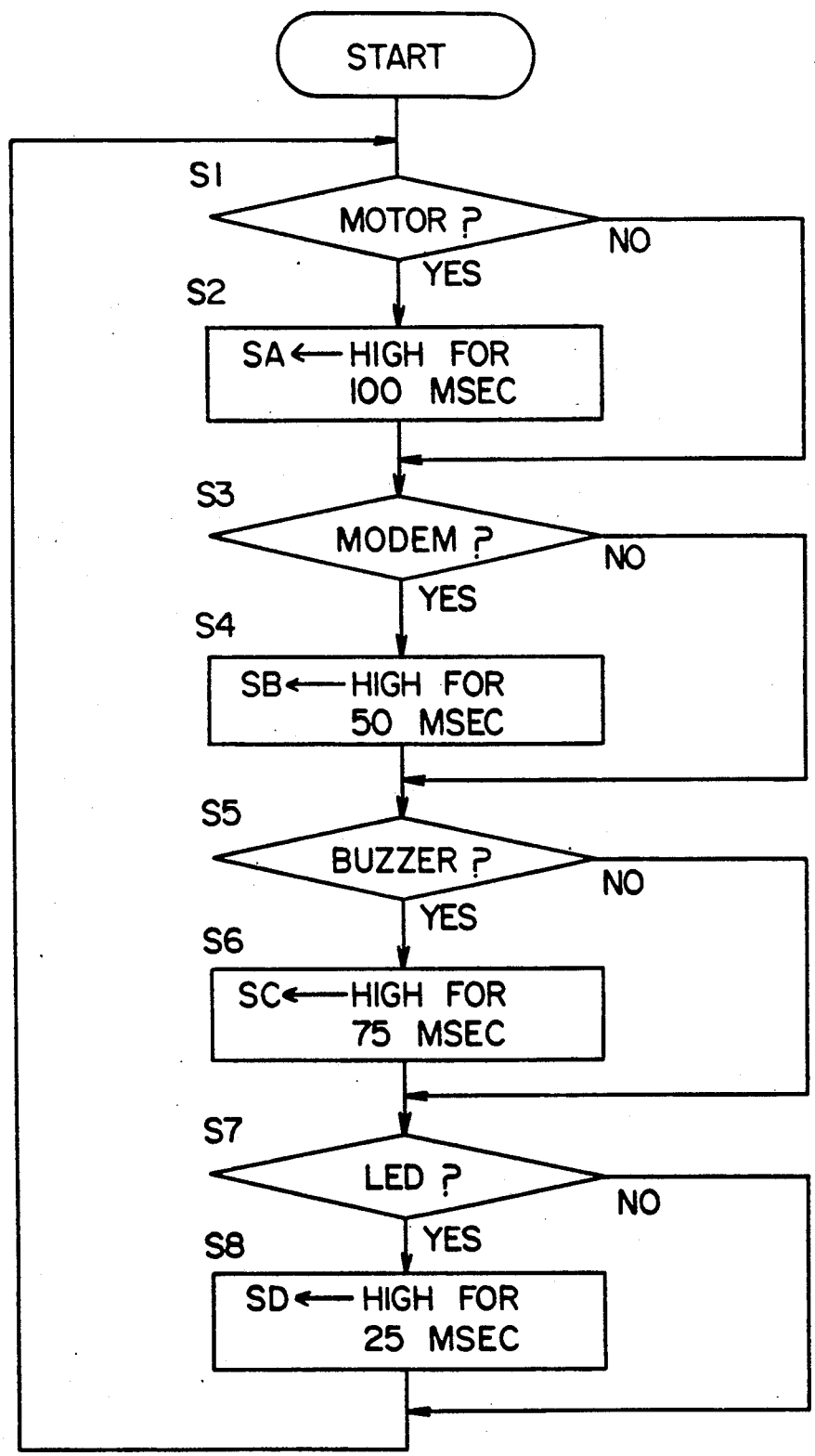
FIG. 2 is a flow chart of the embodiment shown in FIG. 1.
Figure 6:
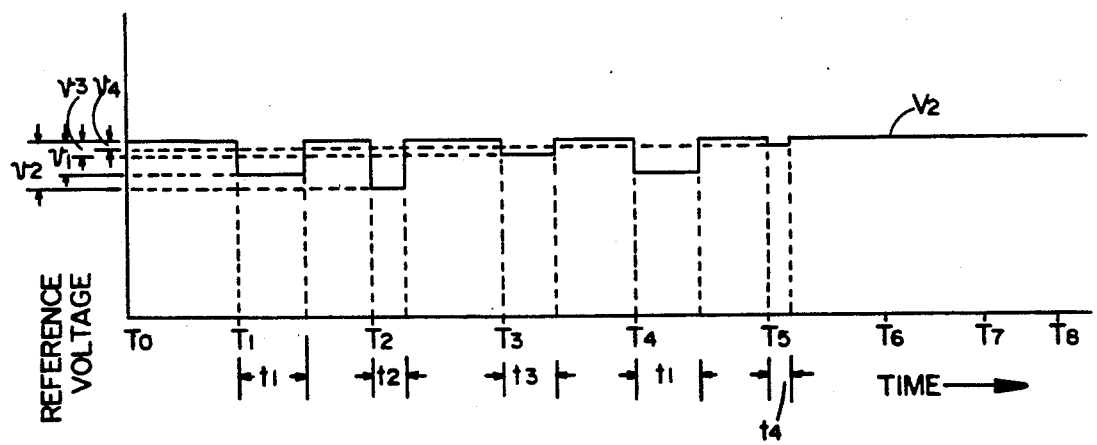
FIG. 6 is a graph showing the variation of the battery voltage in the embodiment of FIG. 1.
Figure 5A:
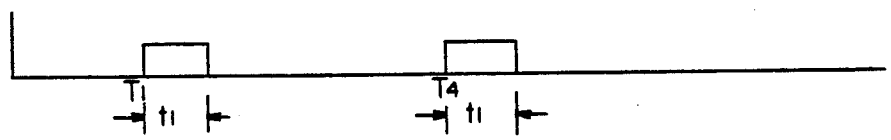
FIGS. 5a-5d are timing charts of the embodiment shown in FIG. 1.
Figure 5B:
Figure 5C:
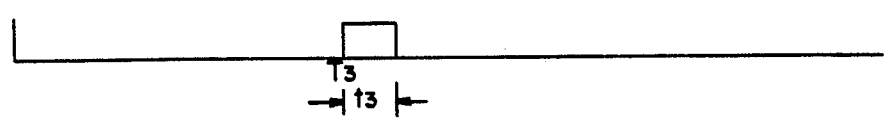
Figure 5D:

The operation of the discriminator circuit during the load changes shown in FIGS. 3 and 4 will be described in detail with reference to FIGS. 2, 5 and 6. When the power supply is turned on, the sequence shown in FIG. 2 starts to sequentially judge whether the motor is started (step S1), whether the modem is connected (step S3), whether the buzzer sounds (step S5), and whether the LED indicator is lit (step S7). If judgment is NO at any of these judgment steps, the process step following the questioned judgment step is jumped, and the process loops. At time $T_1$, judgment is YES at step S1, and as shown in (a) of FIG. 5 a control signal of HIGH is supplied to the first control signal terminal SA for a period of 100 msec (step S2), whereupon the first switching transistor Q1 turns on so that the resistor R5 is connected to the non-inverting input terminal of the comparator CP. Therefore, the reference voltage which has been divided by the resistors R3 and R4 becomes determined by the combination of the resistors R3, R4 and R5 so as to be lowered by $v_1$ (0.5 V) as shown in FIG. 6. If the drop $v_3$ of the battery voltage $V_B$ (i.e., the detection battery voltage $V_1$) due to motor starting is not greater than 0.5 V, no abnormal voltage detection signal LB will be output from the comparator CP.

Similarly, at time $T_2$, judgment is YES at step S3, and as shown in (b) of FIG. 5 a control signal of HIGH is supplied to the second control signal terminal SB for a period of 50 msec (step S4), whereupon the second switching transistor Q2 turns on so that the resistor R6 is connected to the non-inverting input terminal of the comparator CP. The reference voltage is determined by the combination of the resistors R3, R4 and R6 and is lowered by $V_2$ (0.7 V) as shown in FIG. 6. If the drop of the detection battery voltage $V_1$ due to the connection of the modem is not greater than 0.7 V, no abnormal voltage detection signal LB will be output from the comparator CP.

At time $T_3$, judgment is YES at step S5, and as shown in (c) of FIG. 5, a control signal of HIGH is supplied to the third control signal terminal SC for a period of 75 msec (step S6), whereupon the third switching transistor Q3 turns on so that resistor R7 is connected to the non-inverting input terminal of the comparator CP. The reference voltage is determined by the combination of the resistors R3, R4 and R7 and is lowered by $V_3$ (0.2 V) as shown in FIG. 6. If the drop of the detection battery voltage $V_1$ due to the sounding of the buzzer is not greater than 0.2 V, no abnormal voltage detection signal LB will be output from the comparator CP.

At time $T_4$, the procedures in steps S1 and S2 which have been described above are repeated.

At time $T_5$, judgment is YES at step S7, and as shown in (d) of FIG. 5, a control signal of HIGH is supplied to the fourth control signal terminal SD for a period of 25 msec (step S8), whereupon the fourth switching transistor Q4 turns on so that resistor R8 is connected to the non-inverting input terminal of the comparator CP. The reference voltage is determined by the combination of the resistors R3, R4 and R8 and is lowered by $V_4$ (0.1 V) as shown in FIG. 6. If the drop of the detection battery voltage $V_1$ due to the lighting of the LED indicator is not greater than 0.1 V, no abnormal voltage detection signal LB will be output from the comparator CP.

As described above, according to the invention, the reference voltage is changed to one of the predetermined values according to various foreseeable abrupt load changes each time when such load change occurs. Therefore, it is possible to perform accurate capacity management during the service life of the battery without erroneous output of any abnormal voltage detection signal during the occurrence of any abrupt load fluctuation, and thus to achieve efficient use of the battery without waste.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a battery voltage discriminator circuit for an apparatus having battery means, a plurality of loads which are selectively driven by said battery means, and signal means for generating a signal indicative of the battery means voltage dropping below a reference voltage, said circuit further comprising:
    reference voltage setting means for setting said reference voltage to one of plural predetermined values, said plural predetermined values each respectively corresponding to a different one of said loads, said one value corresponding to the load then being driven by said battery means; and
    reference voltage change means for activating said reference voltage setting means for a period of time in response to a change in the load being driven by said battery means.

2. A battery voltage discriminator circuit according to claim 1, wherein said period of time is selected from a plurality of predetermined values, the selected time period corresponding to the load being driven by said battery means.

3. A battery voltage discriminator circuit for continuously testing and indicating the condition of a battery used to selectively drive a plurality of electrical loads which, when initially connected thereto, cause predictable temporary reductions in battery voltage even when the battery condition remains serviceable for further use, said circuit comprising:
    a voltage comparator connected to compare a first input representative of battery voltage with a second input reference voltage representing the minimum acceptable battery voltage for a battery having remaining service capacity and to generate a low battery signal if the first input drops below said reference voltage; and
    a plurality of switches connected and activated selectively in synchronism with the selective driving of said plurality of electrical loads to cause respectively corresponding predictable temporary reductions in said reference voltage thereby preventing premature generation of a low battery signal.

4. A battery voltage discriminator circuit as in claim 3 including:
    a first voltage divider connected across said battery to generate said first comparator input representative of battery voltage;
    a dc-dc converter connected to said battery for generating a controlled substantially constant load voltage output;
    a second voltage divider connected across said load voltage output to generate a nominal first reference voltage as said comparator second input reference voltage; and
    a plurality of resistances connected between said second voltage divider and respectively corresponding ones of said switches for selectively reducing the comparator input reference voltage from said nominal first reference voltage when activated.

5. A battery voltage discriminator circuit as in claim 4 for use with a computer that selectively activates said loads, said computer being programmed to also synchronously and correspondingly selectively activate said switches for predetermined respectively associated time intervals each time any of said loads are initially activated.

6. A battery voltage discriminator circuit as in claim 5 wherein each of said time intervals is no greater than approximately 100 milliseconds.

7. A battery voltage discriminator method for continuously testing and indicating the condition of a battery used to selectively drive a plurality of electrical loads which, when initially connected thereto, cause predictable temporary reductions in battery voltage even when the battery condition remains serviceable for further use, said method comprising:
    comparing a first input representative of battery voltage with a second input reference voltage representing the minimum acceptable battery voltage for a battery having remaining service capacity and generating a low battery signal if the first input drops below said reference voltage; and
    selectively causing respectively corresponding predictable temporary reductions in said reference voltage in synchronism with the selective driving of said plurality of electrical loads thereby preventing premature generation of a low battery signal.

8. A battery voltage discriminator method as in claim 7 including, connecting a first voltage divider across said battery to generate said one comparator input representative of battery voltage;

connecting a dc-dc converter to said battery to generate a controlled substantially constant load voltage output;

connecting a second voltage divider across said load voltage output to generate a nominal first reference voltage as said second input reference voltage; and selectively connecting ones of a plurality of resistances to said second voltage divider to selectively reduce the second input reference voltage from said nominal first reference voltage when activated.

9. A battery voltage discriminator method as in claim 8 for use with a computer that selectively activates said loads, said computer being programmed to also synchronously and correspondingly selectively reduce the second input reference voltage for predetermined respectively associated time intervals each time any of said loads are initially activated.

10. A battery voltage discriminator method as in claim 9 wherein each of said time intervals is no greater than approximately 100 milliseconds.

* * * * *